United States Patent
Wang

(10) Patent No.: US 12,262,487 B2
(45) Date of Patent: Mar. 25, 2025

(54) STRETCHABLE DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/432,010

(22) PCT Filed: Aug. 4, 2021

(86) PCT No.: PCT/CN2021/110433
§ 371 (c)(1),
(2) Date: Jan. 26, 2023

(87) PCT Pub. No.: WO2023/000383
PCT Pub. Date: Jan. 26, 2023

(65) Prior Publication Data
US 2024/0023255 A1 Jan. 18, 2024

(30) Foreign Application Priority Data
Jul. 19, 2021 (CN) .......................... 202110813391.9

(51) Int. Cl.
*H05K 5/02* (2006.01)
(52) U.S. Cl.
CPC ................................ *H05K 5/0217* (2013.01)

(58) Field of Classification Search
CPC ..................................................... H05K 5/0217
USPC ......................................................... 361/807
See application file for complete search history.

(56) References Cited

U.S. PATENT DOCUMENTS

| | | | | |
|---|---|---|---|---|
| 11,012,546 | B1* | 5/2021 | Song | G06F 1/1656 |
| 11,249,518 | B2* | 2/2022 | Liao | G06F 1/1658 |
| 2012/0314400 | A1 | 12/2012 | Bohn et al. | |
| 2020/0363841 | A1 | 11/2020 | Kim et al. | |

FOREIGN PATENT DOCUMENTS

| | | |
|---|---|---|
| CN | 102902308 | 1/2013 |
| CN | 106051393 | 10/2016 |
| CN | 106971673 | 7/2017 |
| CN | 110491289 | 11/2019 |
| CN | 210629557 U | 5/2020 |

(Continued)

*Primary Examiner* — Timothy J Thompson
*Assistant Examiner* — Michael F McAllister
(74) *Attorney, Agent, or Firm* — PV IP PC; Wei Te Chung

(57) ABSTRACT

A stretchable display panel and an electronic device are provided. The electronic device has a stretchable display panel. The stretchable display panel has a flexible display panel main body, a linkage holding mechanism, and a frame. The frame has a main frame and a sub frame. The linkage holding mechanism is used to limit a sliding distance and sliding speed of the sub frame to avoid separation of the sub frame and the main frame when an applied external force is too large or sudden change, thereby reducing a risk of damage to the frame and the flexible display panel main body.

20 Claims, 11 Drawing Sheets

(56) References Cited

FOREIGN PATENT DOCUMENTS

| | | |
|---|---|---|
| CN | 211118419 U | 7/2020 |
| CN | 111510536 | 8/2020 |
| CN | 111664337 | 9/2020 |
| CN | 212627978 U | 2/2021 |
| CN | 112466217 | 3/2021 |
| CN | 112991930 | 6/2021 |

* cited by examiner

STRETCHABLE DISPLAY PANEL AND ELECTRONIC DEVICE

FIELD OF DISCLOSURE

The present disclosure relates to displays, and more particularly to a stretchable display panel and an electronic device.

BACKGROUND OF DISCLOSURE

Flexible organic light emitting diode (OLED) display technology is becoming more mature. Foldable display products have entered the commercialization stage, and with continuous breakthroughs in related technologies, to a large extent, small and medium-sized flexible display panels have been promoted to expand and fold in the direction of display. In order to meet consumers' needs for wide screen, interactive screen, and extended screen use on display devices such as mobile phones, tablets, and TVs, flexible widescreen displays have become a key research direction. The difficulty of flexible widescreen display technology is mainly focused on how to realize the portability and thin structure design of the whole electronic equipment.

At this stage, the structural design of flexible display electronic devices is mainly divided into three types: folding type, curling type, and stretch type. The folding-type electronic device is divided into an outward-folding type and an inward-folding type. For outward-folding electronic devices, because the screen is exposed to the outside of the whole machine, it is extremely susceptible to external friction, and scratches are prone to appear after a period of use, which greatly affects its appearance. For inward-folding electronic devices, limited by the thickness and size of the entire machine, the bending radius of the screen is often designed to be small. Usually, after a certain number of bendings, the bending area of the screen is prone to crease phenomenon. The inward and outward bi-folding display device has a three-layer structure in the thickness direction when the whole structure is folded. The overall thickness will inevitably occupy a large space, resulting in poor portability. At present, there is no better solution for the appearance optimization design. In addition, the curling-type display mode has achieved flexibility and expandable display to a certain extent. Due to the limitation of the number of curling circles and the curling radius, the design of the transmission mechanism and screen storage structure of the whole machine is very complicated, and it cannot meet the functional requirements of thin and light design. The stretch-type display mode can realize the stretchable expansion display structure design by relatively sliding the main frame and the sub frame. However, the sub frame cannot maintain the smoothness and stability of the transmission during the unfolding process, and when the applied external force is too large or sudden, the sub frame may separate from the main frame, causing damage to the frame and the display panel.

From above, the existing stretchable display panel and electronic device have the problem that the frame cannot maintain the smoothness and stability of the transmission during the unfolding process, which causes damage to the frame and the display panel. Therefore, it is necessary to provide a stretchable display panel and an electronic device to improve this defect.

SUMMARY OF DISCLOSURE

The embodiments of the present application provide a stretchable display panel and an electronic device, which is used to solve the problem that the frame of the existing stretchable display panel and the electronic device cannot maintain the smoothness and stability of the transmission during the unfolding process, which causes damage to the frame and the display panel.

An embodiment of the present application provides a stretchable display panel, comprising:
- a flexible display panel main body comprising: a main body portion and a flexible portion connected to the main body portion;
- a linkage holding mechanism; and
- a frame comprising:
  - a main frame, wherein the main body portion is fixedly installed on the main frame; and
  - a sub frame slidably connected to the main frame along a first direction, wherein the flexible portion is movably installed on the secondary frame,
- wherein the linkage holding mechanism is rotatably connected to one of the main frame and the sub frame, the linkage holding mechanism is slidably connected to the other of the main frame and the sub frame, and a linear motion of the sub frame is converted into a circular sliding motion of the linkage holding mechanism.

According to an embodiment of the application, the linkage holding mechanism comprises:
- a first connection rod, wherein one end of the first connection rod is rotatably connected to one of the main frame and the sub frame, and the other end of the first connection rod is slidably connected to the other of the main frame and the sub frame; and
- a second connecting rod arranged opposite to the first connecting rod, wherein one end of the connecting rod is rotatably connected to one of the main frame and the sub frame, and the other end of the second connecting rod is slidably connected to the other of the main frame and the sub frame.

According to an embodiment of the application, the main frame or the sub frame is provided with a first sliding groove and a second sliding groove, the linkage holding mechanism further includes a first fixing member and a second fixing member, the first fixing member passes through the first sliding groove and is fixedly connected to the other end of the first connecting rod, and the second fixing member passes through the second sliding groove and is fixedly connected to the other end of the second connecting rod,
  wherein, when the flexible portion is in a first state, the sub frame is close to the main frame, and the first fixing member and the second fixing member are close to each other; and when the flexible member is in the second state, the sub frame is away from the main frame, and the first fixing member and the second fixing member are away from each other.

According to an embodiment of the application, the first sliding groove is a straight groove or an arc groove, and the second sliding groove is the same size and shape as the first sliding groove.

According to an embodiment of the application, the first sliding groove is a linear groove, a length direction of the first sliding groove is parallel or inclined to a second direction, and the second direction is perpendicular to the first direction.

According to an embodiment of the application, the linkage holding mechanism comprises a first linkage holding mechanism and a second linkage holding mechanism, and the sub frame comprises a first sub frame and a second sub frame,
  wherein:

the first sub frame is slidably connected to the main frame, the first linkage holding mechanism is rotatably connected to one of the main frame and the first sub frame, and the first linkage holding mechanism is slidably connected to the other of the main frame and the first sub frame; and the second sub frame is arranged opposite to the first sub frame and is slidably connected to the main frame, the second linkage holding mechanism is rotatably connected to one of the main frame and the second sub frame, and the second linkage holding mechanism is slidably connected to the other of the main frame and the second sub frame.

According to an embodiment of the application, the main frame is provided with a plurality of sliding grooves arranged at intervals, and the sub frame is provided with a plurality of supporting bars arranged at intervals, wherein the supporting bars are slidably received in the sliding grooves.

According to an embodiment of the application, one end of the sub frame away from the main frame is arc-shaped.

According to an embodiment of the application, the stretchable display panel comprises a winding mechanism, and the winding mechanism is installed in the frame, wherein, one end of the flexible portion is connected to the main body portion, and the other end of the flexible portion is fixedly connected to the winding mechanism.

According to an embodiment of the application, the winding mechanism comprises an elastic member, and the other end of the flexible portion is fixedly connected to the elastic member, wherein, when the flexible portion is in a first state or a second state, the elastic member is in an elastic deformation state.

According to an embodiment of the application, the stretchable display panel further comprises a transmission member, the transmission member is rotatably connected to the sub frame, and the flexible portion is movably connected to the transmission member.

According to an embodiment of the application, the transmission member comprises a gear, the gear is rotatably connected to the sub frame, and the flexible portion comprises a crawler-type supporting plate, and the crawler-type supporting plate meshes with the gear.

According to an embodiment of the application, the main body portion comprises a first display layer, the flexible portion comprises a second display layer and an edge stress buffer layer, one end of the second display layer is connected to the first display layer, and the other end of the second display layer is connected to the edge stress buffer layer.

An embodiment of the present application provides an electronic device stretchable display panel comprising a stretchable display panel, wherein the stretchable display panel comprises:

a flexible display panel main body comprising: a main body portion and a flexible portion connected to the main body portion;

a linkage holding mechanism; and a frame comprising:

a main frame, wherein the main body portion is fixedly installed on the main frame; and a sub frame slidably connected to the main frame along a first direction, wherein the flexible portion is movably installed on the secondary frame, wherein the linkage holding mechanism is rotatably connected to one of the main frame and the sub frame, the linkage holding mechanism is slidably connected to the other of the main frame and the sub frame, and a linear motion of the sub frame is converted into a circular sliding motion of the linkage holding mechanism.

According to an embodiment of the application, the linkage holding mechanism comprises:

a first connection rod, wherein one end of the first connection rod is rotatably connected to one of the main frame and the sub frame, and the other end of the first connection rod is slidably connected to the other of the main frame and the sub frame; and a second connecting rod arranged opposite to the first connecting rod, wherein one end of the connecting rod is rotatably connected to one of the main frame and the sub frame, and the other end of the second connecting rod is slidably connected to the other of the main frame and the sub frame.

According to an embodiment of the application, the main frame or the sub frame is provided with a first sliding groove and a second sliding groove, the linkage holding mechanism further includes a first fixing member and a second fixing member, the first fixing member passes through the first sliding groove and is fixedly connected to the other end of the first connecting rod, and the second fixing member passes through the second sliding groove and is fixedly connected to the other end of the second connecting rod, wherein, when the flexible portion is in a first state, the sub frame is close to the main frame, and the first fixing member and the second fixing member are close to each other; and when the flexible member is in the second state, the sub frame is away from the main frame, and the first fixing member and the second fixing member are away from each other.

According to an embodiment of the application, the first sliding groove is a straight groove or an arc groove, and the second sliding groove is the same size and shape as the first sliding groove.

According to an embodiment of the application, the first sliding groove is a linear groove, a length direction of the first sliding groove is parallel or inclined to a second direction, and the second direction is perpendicular to the first direction.

According to an embodiment of the application, the linkage holding mechanism comprises a first linkage holding mechanism and a second linkage holding mechanism, and the sub frame comprises a first sub frame and a second sub frame, wherein:

the first sub frame is slidably connected to the main frame, the first linkage holding mechanism is rotatably connected to one of the main frame and the first sub frame, and the first linkage holding mechanism is slidably connected to the other of the main frame and the first sub frame; and the second sub frame is arranged opposite to the first sub frame and is slidably connected to the main frame, the second linkage holding mechanism is rotatably connected to one of the main frame and the second sub frame, and the second linkage holding mechanism is slidably connected to the other of the main frame and the second sub frame.

According to an embodiment of the application, the main frame is provided with a plurality of sliding grooves arranged at intervals, and the sub frame is provided with a plurality of supporting bars arranged at intervals, wherein the supporting bars are slidably received in the sliding grooves.

Beneficial effects of embodiments of the present disclosure are that: an embodiment of the present disclosure provides a stretchable display panel and an electronic device, comprising a stretchable display panel, wherein the stretchable display panel comprises: a flexible display panel main body, a linkage holding mechanism, and a frame. The flexible display panel main body comprises: a main body portion and a flexible portion connected to the main body portion. The frame comprises a main frame and a sub frame. The main body portion is fixedly installed on the main frame. The sub frame is slidably connected to the main frame along a first direction, wherein the flexible portion is movably installed on the secondary frame. The linkage holding mechanism is rotatably connected to one of the main frame and the sub frame, the linkage holding mechanism is slidably connected to the other of the main frame and the sub frame, and a linear motion of the sub frame is converted into a circular sliding motion of the linkage holding mechanism. In this way, through the circular sliding movement of the linkage holding mechanism, the smoothness and stability of the sliding of the sub frame relative to the main frame are improved, and the linkage holding mechanism is used to limit the sliding distance of the sub frame relative to the main frame to avoid the separation of the sub frame and the main frame when the applied external force is too large or sudden change, thereby reducing the risk of damage to the frame and the flexible display panel main body.

DESCRIPTION OF DRAWINGS

In order to explain the embodiments or the technical solutions in the prior art more clearly, the following will briefly introduce the drawings that need to be used in the description of the embodiments or the prior art. Obviously, the drawings in the following description are only some of the disclosed embodiments. For those of ordinary skill in the art, other drawings can be obtained based on these drawings without creative work.

DETAILED DESCRIPTION OF PREFERRED EMBODIMENTS

Figure 1:
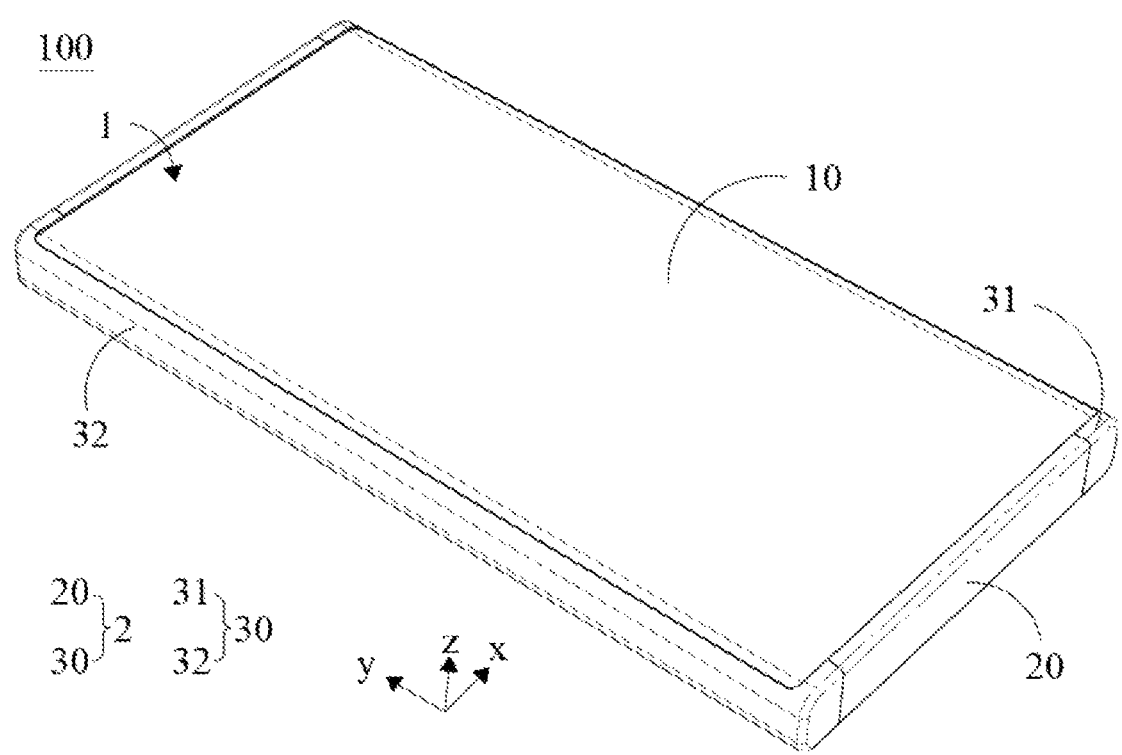
FIG. 1 is a schematic diagram of a stretchable flexible display panel provided by an embodiment of the application in a fully folded state.

The description of the following embodiments refers to the attached drawings to illustrate specific embodiments that the present disclosure can be implemented. The directional terms mentioned in this disclosure, such as "top", "bottom", "front", "back", "left", "right", "inside", "outside", "side", etc., are merely for referring to the direction of the attached drawings. Therefore, the directional terms used are used to illustrate and understand the present disclosure, rather than to limit the present disclosure. In the figures, units with similar structures are indicated by the same reference numerals.

The disclosure will be further described below in conjunction with the drawings and specific embodiments.

The embodiments of the present application provide a stretchable display panel and an electronic device.

The electronic device may be a mobile terminal, such as a smart phone, a tablet computer, a notebook computer, etc. The electronic device can also be a wearable terminal, such as smart watches, smart bracelets, smart glasses, augmented reality devices, etc. The electronic device can also be a fixed terminal, such as a desktop computer, a TV, and so on.

The electronic device includes a stretchable display panel 100, and the stretchable display panel 100 is an organic light emitting diode display panel. In practical applications, a type of the stretchable display panel 100 is not limited to the above-mentioned organic light emitting diode display panel, and may also be a micro light emitting diode display panel.

The stretchable display panel 100 includes a flexible display panel main body 1, a frame 2, and a linkage holding mechanism 4. The flexible display panel main body 1 includes a main body portion 10 and a flexible portion 11 connected to the main body portion 10. The frame 2 includes a main frame 20 and a sub frame 30. The sub frame 30 is slidably connected to the main frame 20 and can slide relative to the main frame 20.

The main body portion 10 of the flexible display panel main body 1 is fixedly installed on the main frame 20. The flexible portion 11 can be movably installed on the sub frame 30. The linkage holding mechanism 4 is rotatably connected to one of the main frame 20 and the sub frame 30, and the linkage holding mechanism 4 is slidably connected to the other of the main frame 20 and the sub frame 30, where a linear motion of the sub frame 30 is converted into a circular sliding motion of the linkage holding mechanism 4.

The circular sliding movement of the linkage holding mechanism 4 improves the smoothness and stability of the sliding of the sub frame 30 relative to the main frame 20 and uses a pulling force and a friction force exerted by the linkage holding mechanism 4 on the sub frame 30, so as to limit a sliding speed and a sliding distance of the sub frame 30 relative to the main frame 20 and to avoid separation of the sub frame 30 and the main frame 20 when the applied external force is too large or sudden change. Therefore, a risk of damage to the frame 2 and the flexible display panel main body 1 is reduced.

Figure 2:
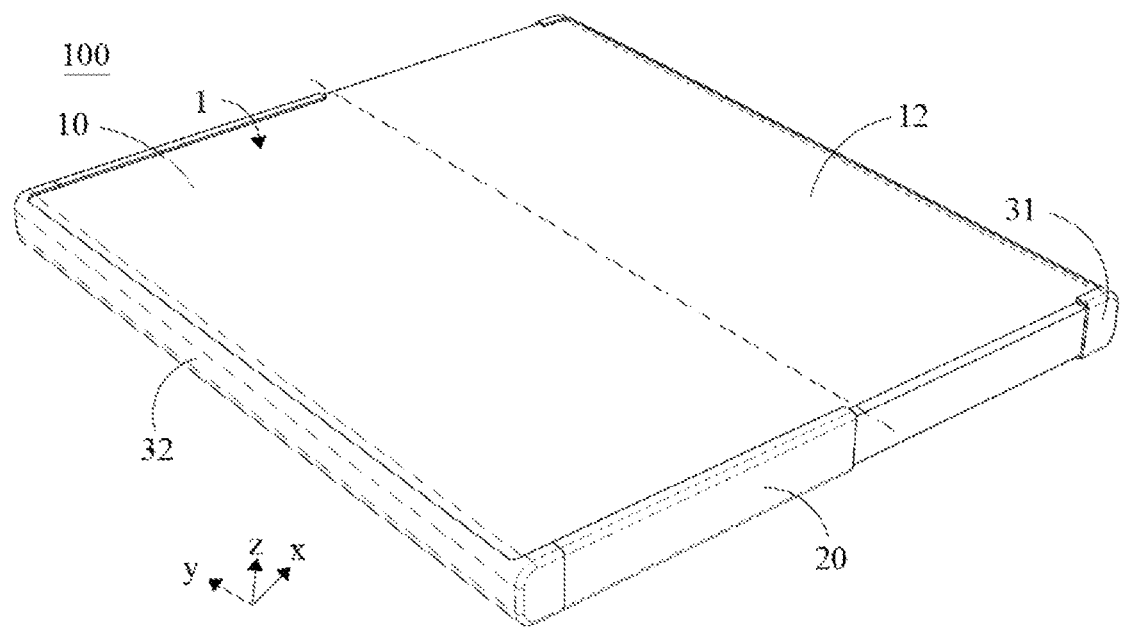
FIG. 2 is a schematic diagram of a stretchable flexible display panel provided by an embodiment of the application in a unilaterally unfolded state.
Figure 3:
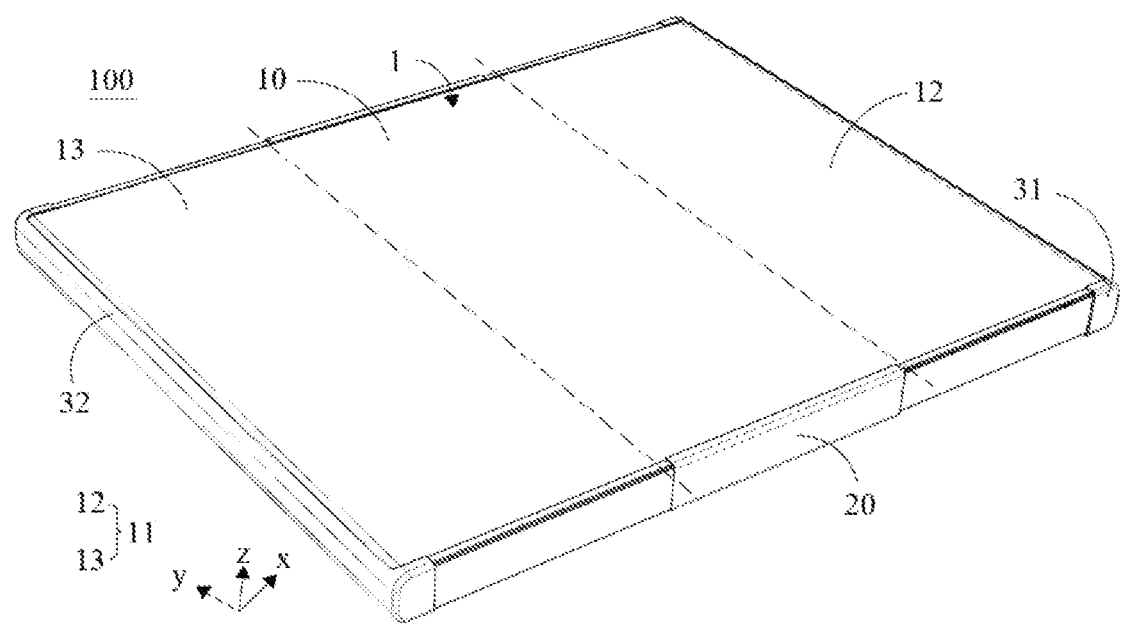
FIG. 3 is a schematic diagram of a stretchable flexible display panel provided in an embodiment of the application in a bilaterally unfolded state.
Figure 6:
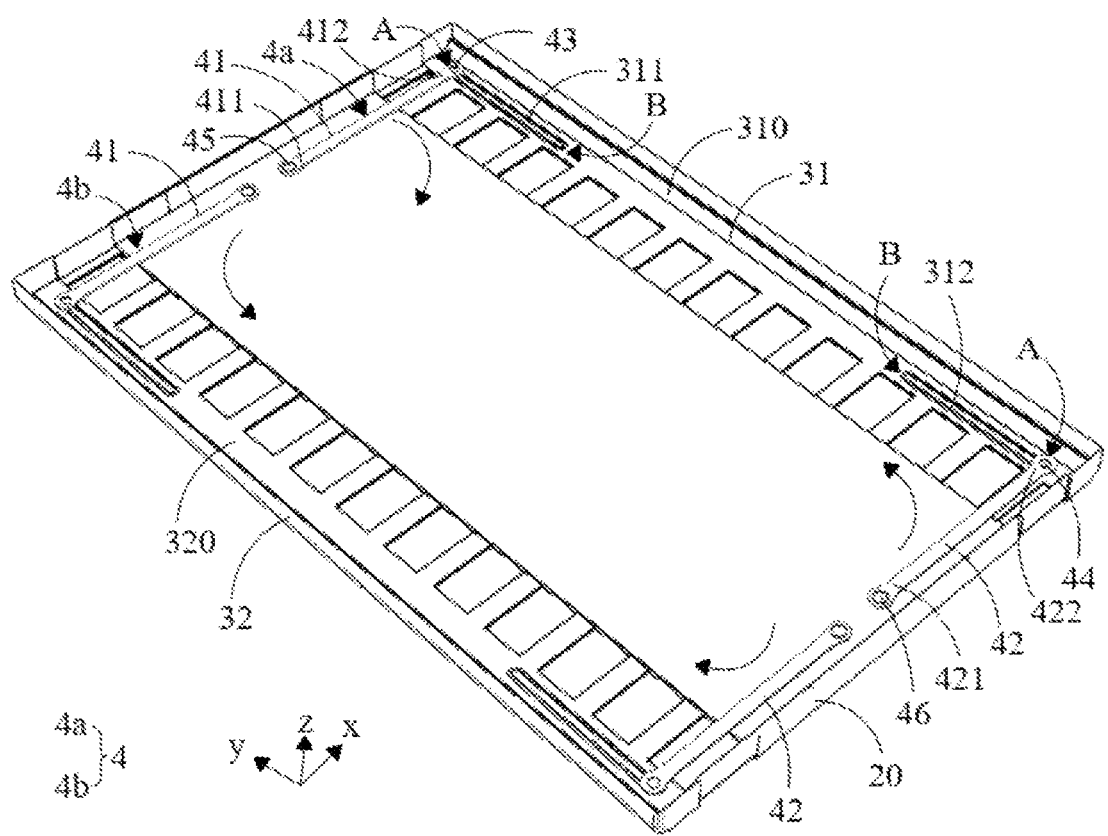
FIG. 6 is a schematic structural diagram of a first type of frame provided by an embodiment of the application.

Refer to FIGS. 1 to 3 and FIG. 6. FIG. 1 is a schematic diagram of a stretchable flexible display panel provided by an embodiment of the application in a fully folded state. FIG. 2 is a schematic diagram of a stretchable flexible display panel provided by an embodiment of the application in a unilaterally unfolded state. FIG. 3 is a schematic diagram of a stretchable flexible display panel provided in an embodiment of the application in a bilaterally expanded state. FIG. 6 is a schematic diagram of a principle of the unfolding movement of the frame provided by the embodiment of the application.

In an embodiment of the present application, the sub frame 30 includes two sub frames, which are a first sub frame 31 and a second sub frame 32, respectively. The first sub frame 31 is slidably connected to the main frame 20. The second sub frame 32 is arranged opposite to the first sub frame 31 and is slidably connected to the main frame 20. Both the first sub frame 31 and the second sub frame 32 can slide relative to the main frame 20.

The flexible portion 11 of the flexible display panel main body 1 includes a first flexible portion 12 and a second flexible portion 13. The first flexible portion 12 and the second flexible portion 13 are respectively connected to opposite ends of the main body portion 10. The first flexible portion 12 is movably installed on the first sub frame 31, and the second flexible portion 13 is movably installed on the second sub frame 32.

In practical applications, the stretchable display panel 100 may also have only one sub frame 30 and one linkage holding mechanism 4. As shown in FIGS. 1 and 2, when the stretchable display panel 100 has only one sub frame 30, the stretchable display panel 100 may have a folded state as shown in FIG. 1 and a unilateral unfolded state as shown in FIG. 2. Using the linkage holding mechanism 4 also improves the sliding smoothness and stability of the sub frame 30 and reduces the risk of damage to the frame 2 and the flexible display panel main body 1.

Figure 4:
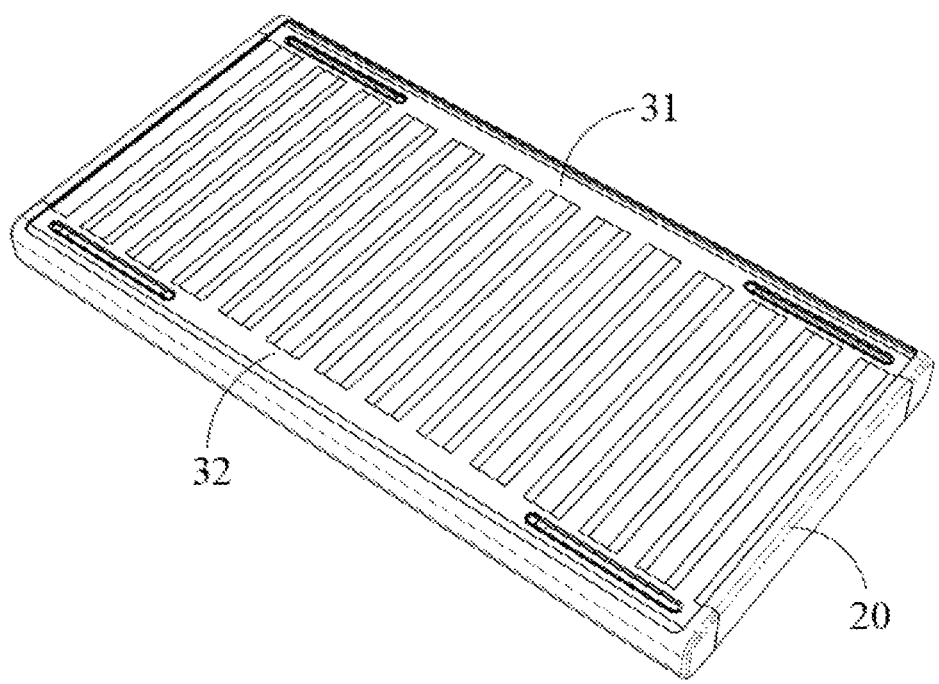
FIG. 4 is a schematic diagram of the frame provided by an embodiment of the application in a fully folded state.

As shown in FIG. 1 and FIG. 4, FIG. 4 is a schematic diagram of the frame provided by an embodiment of the application in a fully folded state. When the stretchable display panel 100 is in a fully folded state, the first sub frame 31 and the second sub frame 32 are both close to the main frame 20 and can be at least partially received in the main frame 20, and the main body portion 10 is exposed to the outside of the frame 2 and is used to realize the function of screen display. At least part of the first flexible portion 12 and the second flexible portion 13 can be received in the receiving space in the frame 2, thereby reducing the size of the stretchable display panel 100 and the electronic device. Thereby, the portability of the electronic device is improved, and the first flexible portion 12 and the second flexible portion 13 can be prevented from being worn and scratched.

When the stretchable display panel 100 is in the unilateral unfolded state as shown in FIG. 2, the user can stretch the first sub frame 31 such that the first sub frame 31 is slid relative to the main frame 20 and away from the main frame 20 in a first direction x indicated by the arrow, while exposing at least part of the first flexible portion 12 to the outside of the frame 2. At least a part of the first flexible portion 12 may be on the same plane as the main body portion 10, and may realize the function of screen display together with the main body portion 10. The second sub frame 32 is close to the main frame 20 and is kept in a stowed state, and the second flexible portion 13 can be received in the receiving space in the frame 2. In practical applications, the second flexible portion 13 may also be exposed to the outside of the frame 2, and the first flexible portion 12 can be received in the receiving space in the frame 2.

In practical applications, a user can choose to unfold one of the first flexible portion 12 and the second flexible portion 13 and to receive the other of the first flexible portion 12 and the second flexible portion 13 in the receiving space of the frame 2 according to actual needs. In this way, a display area greater than or equal to 1.8 times in the folded state as shown in FIG. 1 can be obtained.

Figure 5:
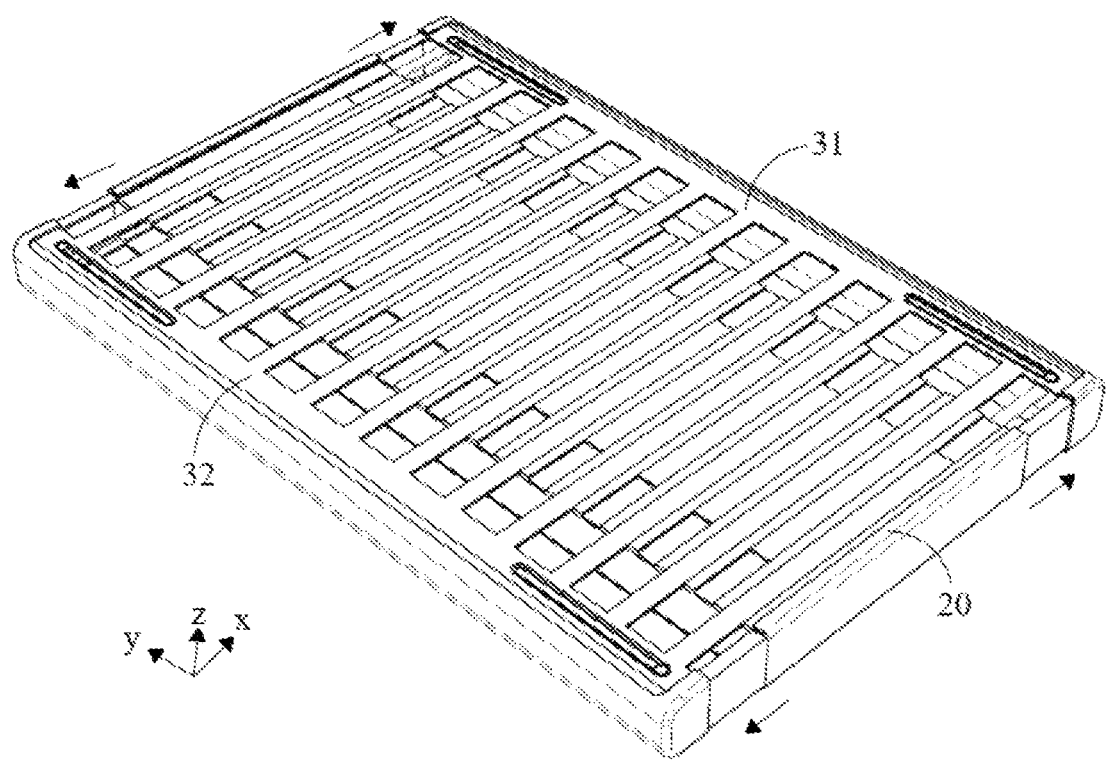
FIG. 5 is a schematic diagram of the frame in a bilaterally unfolded state.

As shown in FIG. 3 and FIG. 5, FIG. 5 is a schematic diagram of the frame in a bilaterally unfolded state. When the stretchable display panel 100 is in a bilaterally unfolded state, a user can stretch the first sub frame 31 and the second sub frame 32, such that the first sub frame 31 and the second sub frame 32 are slid relative to and away from the main frame 20 in the first direction x and the direction opposite to the first direction x, respectively, and at the same time, at least part of the first flexible portion 12 and the second flexible portion 13 are exposed to the outside of the frame 2. At least part of the first flexible portion 12 and the second flexible portion 13 can be on a same plane as the main body portion 10, and can be with the main body portion 10 to realize the screen display function. In this way, a display area greater than or equal to 2.8 times in the folded state as shown in FIG. 1 can be obtained.

Further, the linkage holding mechanism 4 includes a first connecting rod 41 and a second connecting rod 42. One end of the first connecting rod 41 is rotatably connected to one of the main frame 20 and the sub frame 30, and the other end of the first connecting rod 41 is slidably connected to the other of the main frame 20 and the sub frame 30. The second connecting rod 42 is arranged opposite to the first connecting rod 41. One end of the second connecting rod 42 is rotatably connected to one of the main frame 20 and the sub frame 30, and the other end of the second connecting rod 42 is slidably connected to the other of the main frame 20 and the sub frame 30.

In an embodiment, as shown in FIG. 6, the linkage holding mechanism 4 includes a first linkage holding mechanism 4a and a second linkage holding mechanism 4b. The first linkage holding mechanism 4a and the second linkage holding mechanism 4b have the same structure, and both include a first connecting rod 41 and a second connecting rod 42.

Taking the first linkage holding mechanism 4a and the first sub frame 31 in FIG. 6 as an example for description, the first end 411 of the first connecting rod 41 is rotatably connected to the main frame 20, and the second end 412 of the first connecting rod 41 is slidably connected to the first sub frame 31. The first end 421 of the second connecting rod 42 is rotatably connected to the main frame 20, and the second end 422 of the second connecting rod 42 is slidably connected to the first sub frame 31.

Specifically, the first sub frame 31 has a first supporting plate 310, which is used to support the main body portion 10 and the first flexible portion 12 in a unfolded state or a folded state. One end of the first supporting plate 310 facing away from the main frame 20 is provided with a first sliding groove 311 and a second sliding groove 312. The first sliding groove 311 and the second sliding groove 312 both have two ends, which are a first limit point A and a second limit point B, respectively. The second end 412 of the first connecting rod 41 can slide between the first limit point A to the second limit point B of the first sliding groove 311, and the second end 422 of the second connecting rod 42 can slide between the first limit point A to the second limit point B of the second sliding groove 312.

Figure 7:
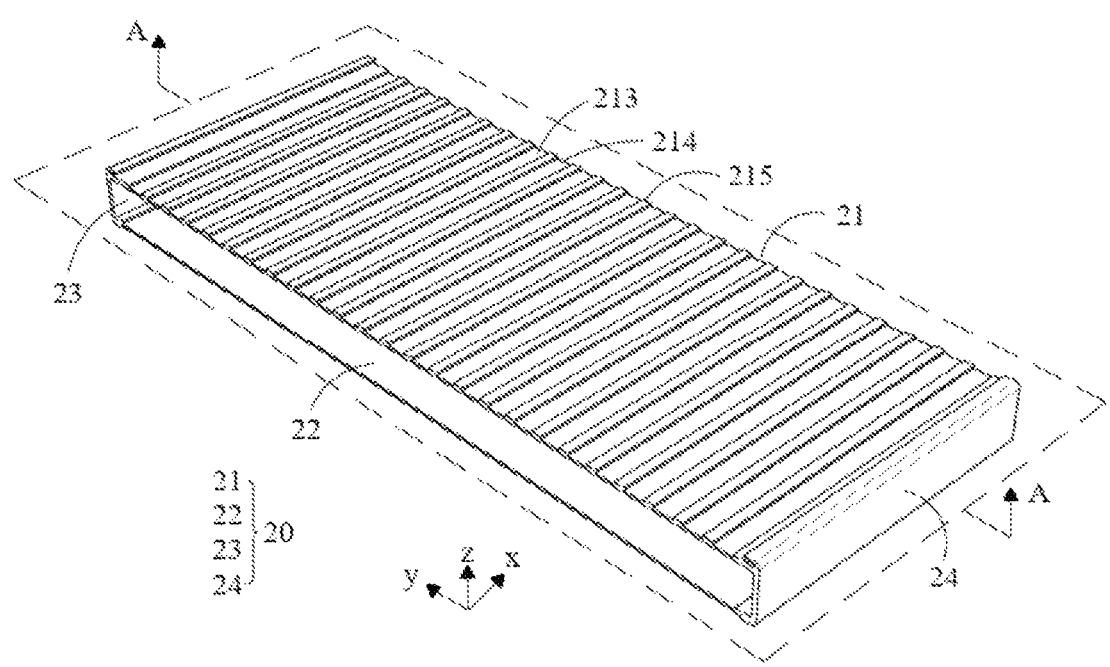
FIG. 7 is a schematic structural diagram of a mainframe provided by an embodiment of the application.
Figure 8:
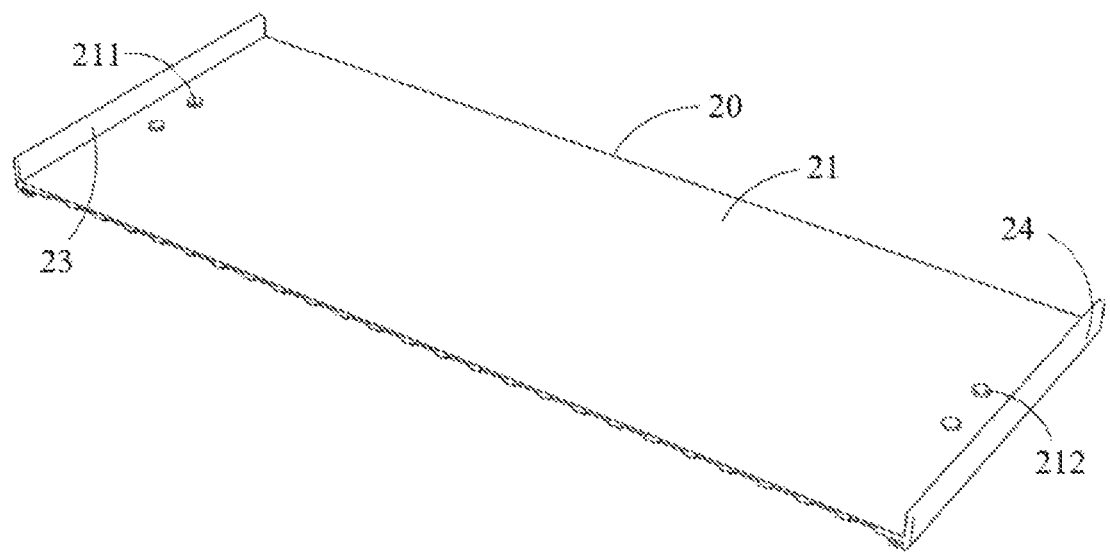
FIG. 8 is a cross-sectional view of the main frame along the A-A direction according to an embodiment of the application.

As shown in FIG. 7 and FIG. 8, FIG. 7 is a schematic structural diagram of a main frame provided by an embodiment of the application, and FIG. 8 is a cross-sectional view of the first main frame provided by an embodiment of the application along the A-A direction. The main frame 20 has: a main supporting plate 21; a main bottom plate 22; and a first connecting plate 23 and a second connecting plate 24, both of which are located at opposite ends of the main supporting plate 21 and connect the main supporting plate 21 and the main bottom plate 22. A side of the main supporting plate 21 close to the main bottom plate 22 is provided with a first pin seat 211 and a second pin seat 212 oppositely disposed.

As shown in FIG. 6 to FIG. 8, the first linkage holding mechanism 4a further includes a first fixing member 43, a second fixing member 44, a third fixing member 45, and a fourth fixing member 46. The first fixing member 43, the second fixing member 44, the third fixing member 45 and the fourth fixing member 46 may all be pins.

The first end 411 of the first connecting rod 41 is rotatably connected to the first pin seat 211 through the third fixing member 45. The first fixing member 43 passes through the first sliding groove 311 and is fixedly connected to the second end 412 of the first connecting rod 41. The first fixing member 43 and the second end 412 of the first connecting rod 41 can slide and rotate relative to the first sliding groove 311. The first end 421 of the second connecting rod 42 is rotatably connected to the second pin seat 212 through the fourth fixing member 46. The second fixing member 44 passes through the second sliding groove 312 and is fixedly connected to the second end 422 of the second connecting rod 42. The second fixing member 44 and the second end 422 of the second connecting rod 42 can slide and rotate relative to the second sliding groove 312.

As shown in FIG. 6, when the frame 2 is in the fully folded state, the flexible portion 11 is in a first state. The first state refers to a state in which the flexible portion 11 is at least partially received in the receiving space in the frame 2. The second end 412 of the first connecting rod 41 and the first fixing member 43 are both located at the second limit point B of the first sliding groove 311. The second end 422 of the second connecting rod 42 and the second fixing member 44 are both located at the second limit point B of the second sliding groove 312. The first fixing member 43 and the second fixing member 44 are close to each other.

When the first sub frame 31 is unfolded from the folded state to the unfolded state, the first end 411 of the first connecting rod 41 rotates around the third fixing member 45. The second end 412 of the first connecting rod 41 and the first fixing member 43 gradually slide from the second limit point B to the first limit point A in the second direction y in the first sliding groove 311. When the frame 2 is unfolded to a bilaterally unfolded state, the second end 412 of the first connecting rod 41 and the first fixing member 43 are both at the first limit point A of the first sliding groove 311.

The first end 421 of the second connecting rod 42 rotates around the fourth fixing member 46. The second end 422 of the second connecting rod 42 and the second fixing member 44 gradually slide from the second limit point B to the first limit point A in the direction opposite to the second direction y in the second sliding groove 312, which are far away from the first fixing member 43.

When the first sub frame 31 is in the unfolded state, the second end 422 of the second connecting rod 42 and the second fixing member 44 are both at the first limit point A of the second sliding groove 312. At this time, the flexible portion 11 is in the second state, which means that the flexible portion 11 is exposed to the outside of the frame 2 and is at least partially in the same plane as the main body portion 10.

When the first sub frame 31 is unfolded from the folded state to the unfolded state, the first connecting rod 41 performs a circular sliding motion in the interval between the first limit point A and the second limit point B along the direction indicated by the arrow around the third fixing member 45, so as to apply a pulling force opposite to the first direction x and a frictional force opposite to the second direction y to the first sub frame 31. The second connecting rod 42 performs a circular sliding movement at the first limit point A and the second limit point B along the direction indicated by the arrow around the fourth fixing member 46, so as to apply the pulling force opposite to the first direction x and the friction force parallel to the second direction y to the first sub frame 31. The first limit point A and the second limit point B are used to block the sliding of the first sub frame 31, so as to limit the sliding speed and sliding distance of the first sub frame 31, and to avoid the separation of the first sub frame 31 from the main frame 20 when the applied external force is too large or sudden change, thereby reducing the risk of damage to the frame 2 and the flexible display panel main body 1. At the same time, the circular sliding movement of the first connecting rod 41 and the second connecting rod 42 toward or away from each other can also be used, such that the two ends of the first sub frame 31 are kept in synchronous movement. Therefore, the sliding smoothness and stability of the first sub frame 31 are improved.

It is noted that, when the frame 2 is unfolded from the fully folded state to the bilaterally unfolded state, the structure and movement of the second sub frame 32 and the second linkage holding mechanism 4b are the same as those of the first sub frame 31 and the first linkage holding mechanism 4a. The exercise process is similar and has the same beneficial effects. For details, please refer to the structure and movement process of the first sub frame 31 and the first linkage holding mechanism 4a, which will not be repeated here.

In addition, the first linkage holding mechanism 4a and the second linkage holding mechanism 4b can also support the first sub frame 31 and the second sub frame 32. The first supporting plate 310 of the first sub frame 31 and the second supporting plate 320 of the second sub frame 32 are prevented from collapsing when receiving pressure in the third direction z.

In an embodiment, as shown in FIG. 6, the first sliding groove 311 and the second sliding groove 312 are both linear grooves, and length directions of the first sliding groove 311 and the second sliding groove 312 are both parallel to the second direction y.

In an embodiment, when the first sliding groove 311 is a linear groove, a length direction of the first sliding groove 311 is inclined to the second direction y and forms a certain angle with the second direction y. The second sliding groove 312 is symmetrically arranged with the first sliding groove 311 and has the same size and shape. The included angle may include, but is not limited to, 3°, 5°, 7°, etc., so that the included angle between the length direction of the first connecting rod 41 and the length direction of the first sliding groove 311 is always greater than 90°, and the included angle between the length direction of the second connecting rod 42 and the length direction of the second sliding groove 312 is always greater than 90°. In this way, the friction force that needs to be overcome when the second end 412 of the first connecting rod 41 and the second end 422 of the second connecting rod 42 start to move from the first limit point A to the second limit point B can be reduced. As a result, the first sub frame 31 can be more smoothly retracted from the unfolded state to the folded state.

In an embodiment, a middle section of the first sliding groove 311 is a straight groove, and both ends of the first sliding groove 311 are arc-shaped grooves. The second sliding groove 312 is symmetrically arranged with the first sliding groove 311, and both have the same size and shape. This can also reduce the friction that the second end 412 of the first connecting rod 41 and the second end 422 of the second connecting rod 42 need to overcome when starting to move from the first limit point A to the second limit point B.

Figure 11:
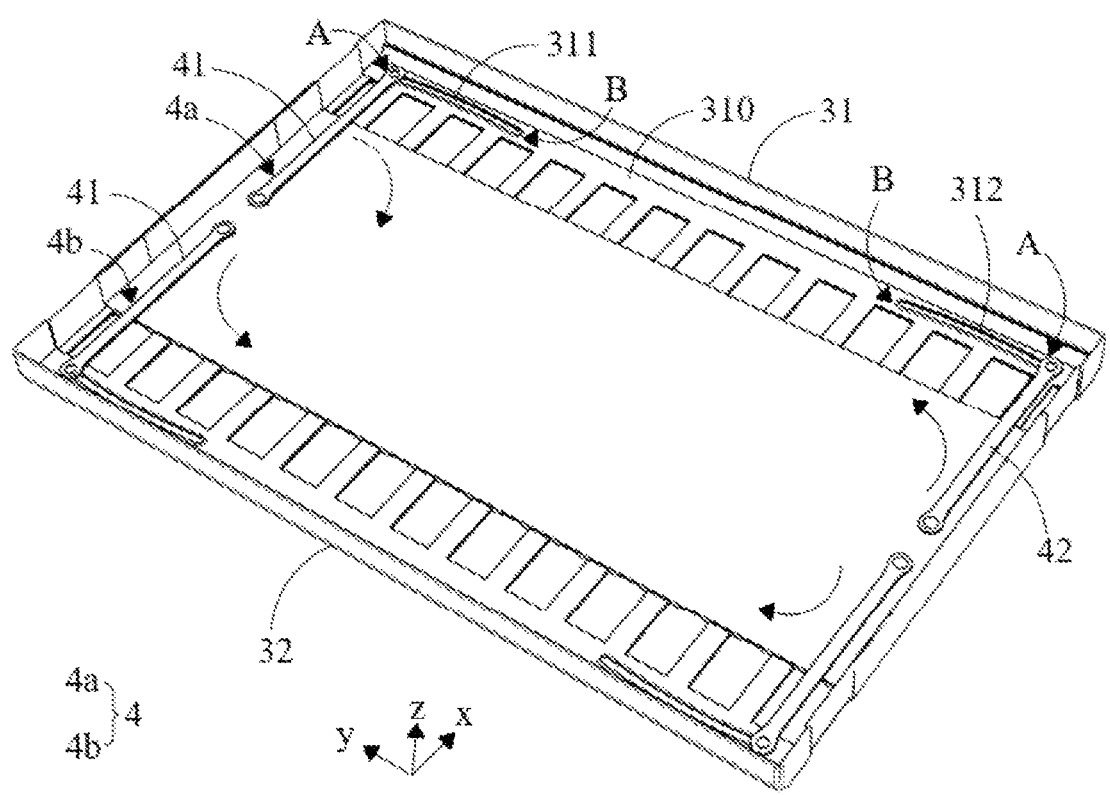
FIG. 11 is a schematic structural diagram of a second type of frame provided by an embodiment of the application.

In an embodiment, as shown in FIG. 11, FIG. 11 is a schematic structural diagram of a second type of frame provided by an embodiment of the application. The first sliding groove 311 and the second sliding groove 312 are both arc-shaped grooves, the first sliding groove 311 is an inwardly curved arc groove relative to the first connecting rod 41, and the second sliding groove 312 is an inwardly curved arc groove relative to the second connecting rod 42. By arranging the first sliding groove 311 and the second sliding groove 312 into arc-shaped grooves, the friction force of the first connecting rod 41 and the second connecting rod 42 during the sliding process can be reduced, which makes the sliding of the first sub frame 31 smoother.

Figure 12:
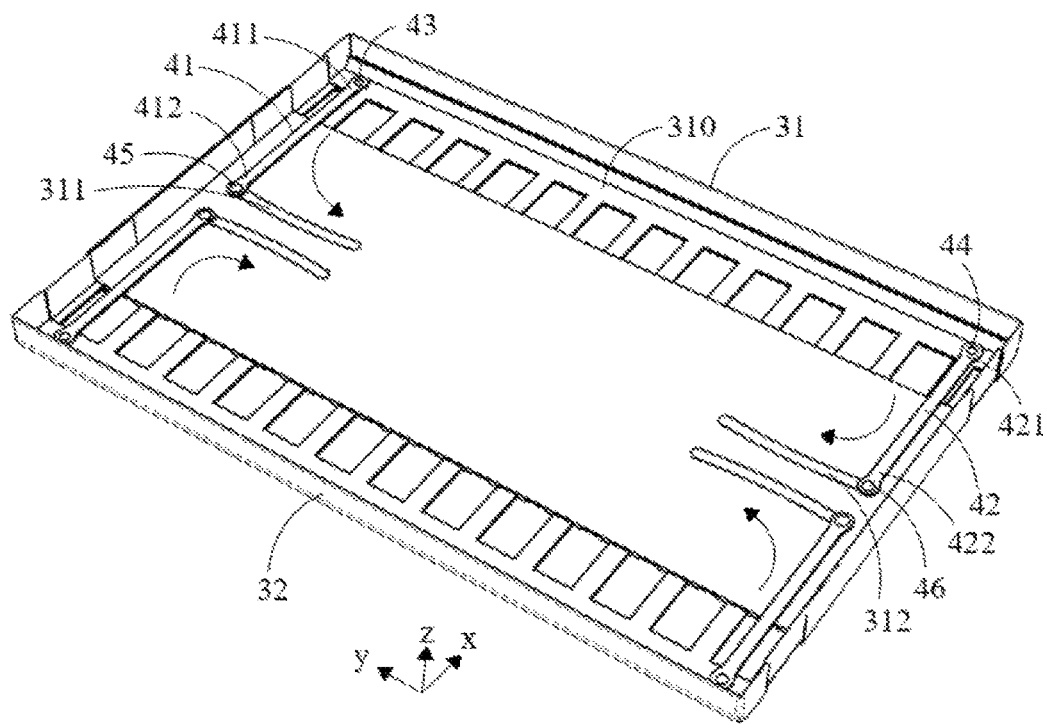
FIG. 12 is a schematic structural diagram of a third type of frame provided by an embodiment of the application.

In an embodiment, as shown in FIG. 12, FIG. 12 is a schematic structural diagram of a third type of frame provided by an embodiment of the application. The first sliding groove 311 and the second sliding groove 312 are disposed at opposite ends of the main frame 20. The first end 411 of the first connecting rod 41 is rotatably connected to the first sub frame 31 through the third fixing member 45. The first fixing member 43 passes through the first sliding groove 311 and is fixedly connected to the second end 412 of the first connecting rod 41. The first end 421 of the second connecting rod 42 is rotatably connected to the first sub frame 31 through a fourth fixing member 46. The second fixing member 44 passes through the second sliding groove 312 and is fixedly connected to the second end 422 of the second connecting rod 42. In the embodiment of the present application, both the first sliding groove 311 and the second sliding groove 312 may be linear grooves or arc-shaped grooves. The movement process and principle of the frame are similar to the movement process and principle of the first type of frame shown in FIG. 6, and will not be repeated here.

Further, the main frame 20 is provided with a plurality of sliding grooves arranged at intervals, and the sub frame 30 is equipped with a plurality of supporting bars arranged at intervals, and the supporting bars are slidably received in the sliding grooves.

Figure 9:
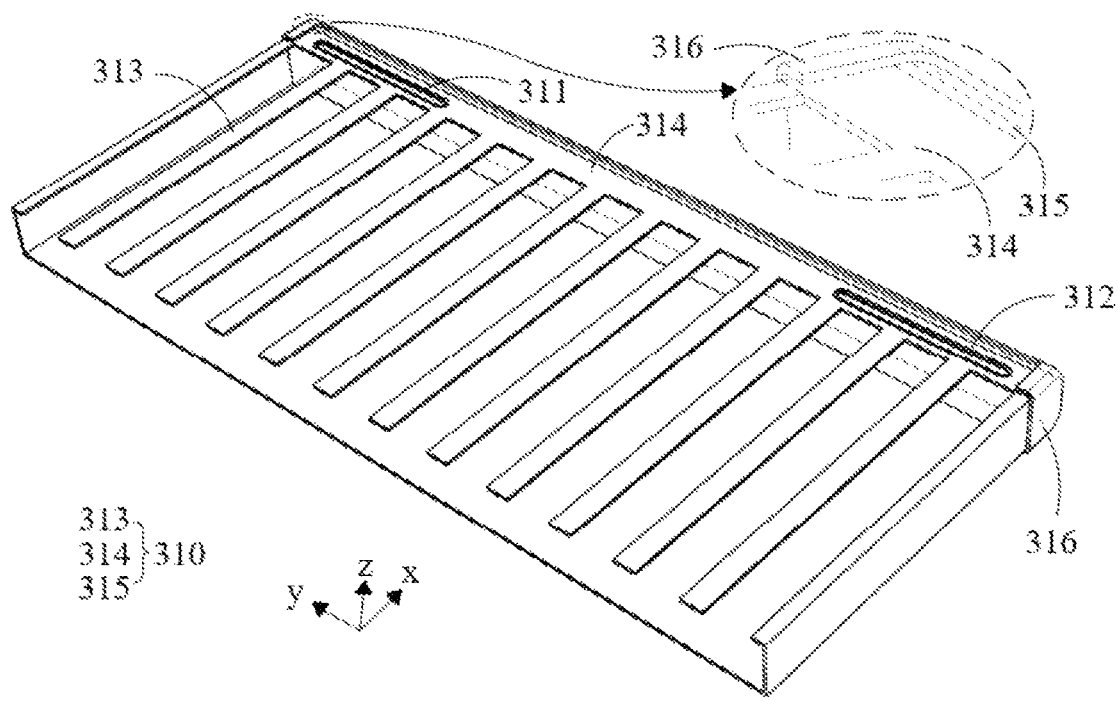
FIG. 9 is a schematic structural diagram of a first sub frame provided by an embodiment of the application.
Figure 10:
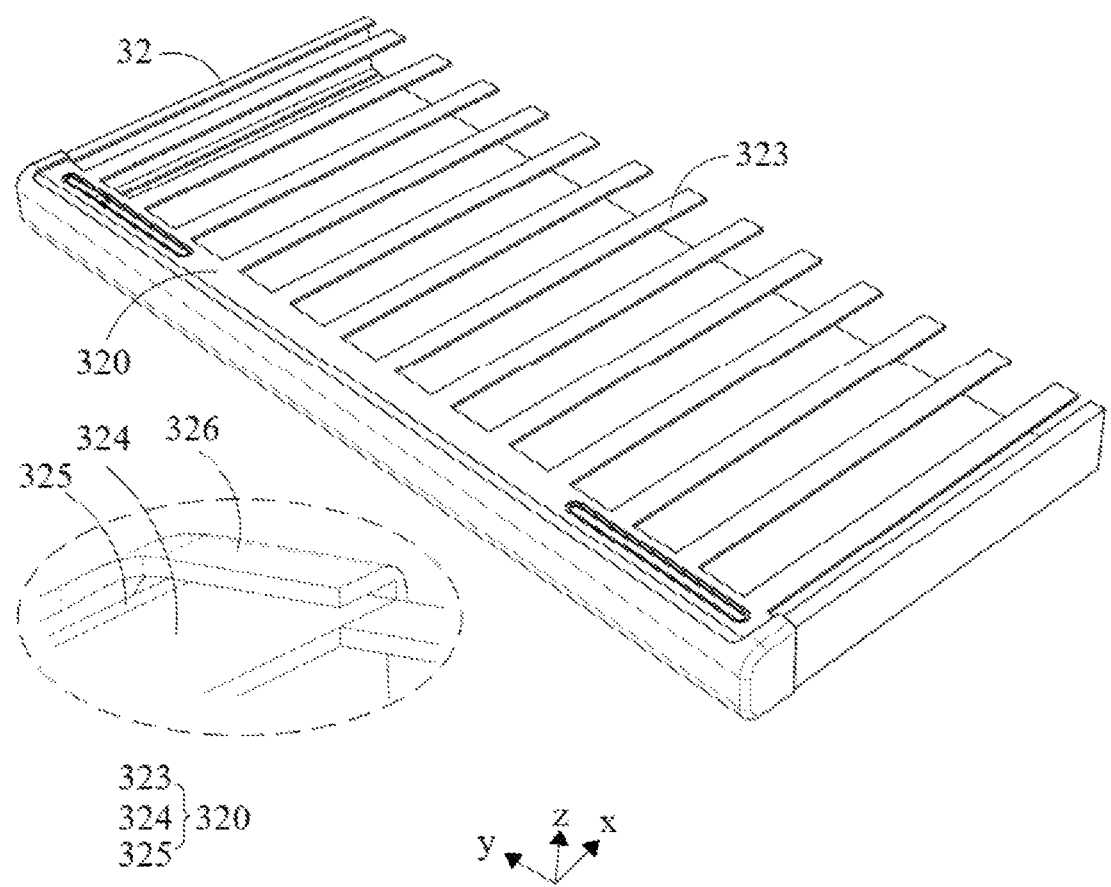
FIG. 10 is a schematic structural diagram of a second sub frame provided by an embodiment of the application.

Refer to FIG. 6 to FIG. 10. FIG. 8 is a schematic structural diagram of a first sub frame provided by an embodiment of the application. FIG. 9 is a schematic structural diagram of a first sub frame provided by an embodiment of the application. FIG. 10 is a schematic structural diagram of a second sub frame provided by an embodiment of the application.

The first supporting plate 310 of the first sub frame 31 is provided with a plurality of first supporting bars 313 arranged at intervals. The second supporting plate 320 of the second sub frame 32 is provided with a plurality of second supporting bars 323 arranged at intervals. The length directions of the first supporting bar 313 and the second supporting bar 323 are parallel to the first direction x.

The main supporting plate 21 of the main frame 20 is provided with a plurality of third sliding grooves 213 and fourth sliding grooves 214 arranged at intervals. The plurality of third sliding grooves 213 and the plurality of fourth sliding grooves 214 are arranged in a staggered arrangement. The first supporting bar 313 is slidably received in the third sliding groove 213. The second supporting bar 323 is slidably received in the fourth sliding groove 214.

During the unfolding of the frame 2, the first supporting bar 313 can slide parallel to the third sliding groove 213, and the second supporting bar 323 can slide parallel to the fourth sliding groove 214, thereby improving the smoothness of the first sub frame 31 and the second sub frame 32 in the unfolding process. At the same time, a protrusion 215 is also provided between the third sliding groove 213 and the fourth sliding groove 214, and the protrusion 215 is in the same plane as the first supporting bar 313 and the second supporting bar 323. In this way, the protrusion 215, the first supporting bars 313, and the second supporting bar 323 are used to support the flexible display panel main body 1 to improve the flatness of the flexible display panel main body 1 in the folded state and the unfolded state.

Specifically, the main body portion 10 of the flexible display panel main body 1 can be attached and fixed to the main supporting plate 21 of the main frame 20 by means of easy pull glue or glue dispensing. The easy pull glue can be arranged on a plurality of protrusions 215 on the main supporting plate 21.

Further, an end of the sub frame 30 away from the main frame 20 is arc-shaped.

In an embodiment of the present application, as shown in FIG. 9, the first supporting plate 310 also has a first supporting portion 314 and a second supporting portion 315. One end of the first supporting portion 314 is connected to the plurality of first supporting bars 313. The other end of the first supporting portion 314 is connected to the second supporting portion 315. The second supporting portion 315 is disposed at an end of the first supporting portion 314 away from the main frame 20. The first supporting portion 314 is a flat supporting portion, and the second supporting portion 315 is arc-shaped and can be used to support the first flexible portion 12 so that the portion of the first flexible portion 12 corresponding to the second supporting portion 315 is curved. The first sub frame 31 also includes a protective cover plate 316, which is fixedly connected to the outer side of the first supporting portion 314 and the second supporting portion 315. In this way, the surface of the first supporting plate 310 bypasses the first supporting portion 314 and the second supporting portion 315 and is received in the first flexible portion 12 in the receiving space of the frame 2.

The second supporting plate 320 of the second sub frame 32 further includes a third supporting portion 324 and a fourth supporting portion 325. One end of the third supporting portion 324 is connected to the plurality of second supporting bars 323. The other end of the third supporting portion 324 is connected to the fourth supporting portion 325. The fourth supporting portion 325 is disposed at an end of the third supporting portion 324 away from the main frame 20. The third supporting portion 324 is a flat supporting portion, and the fourth supporting portion 325 is arc-shaped and can be used to support the second flexible portion 13 so that a portion of the second flexible portion 13 corresponding to the fourth supporting portion 325 is curved. The second sub frame 32 further includes a second protective cover 326, and the second protective cover 326 is fixedly connected to the outside of the third supporting portion 324 and the fourth supporting portion 325. In this way, the second flexible portion 13 bypassing the third supporting portion 324 and the fourth supporting portion 325 by the surface of the second supporting plate 320 is protected.

When the electronic device is in the fully folded state, unilaterally folded state, or bilaterally folded state, at least part of the first flexible portion 12 and the second flexible portion 13 may be located on the second supporting portion 315 of the first sub frame 31 or the second sub frame. In this way, the first flexible portion 12 and the second flexible portion 13 on the second supporting portion 315 are both curved, so that the electronic device can maintain the display effect of the left and right sides of the curved surface under different conditions.

Further, the stretchable display panel 100 includes a winding mechanism, and the winding mechanism is installed in the frame.

Figure 13:
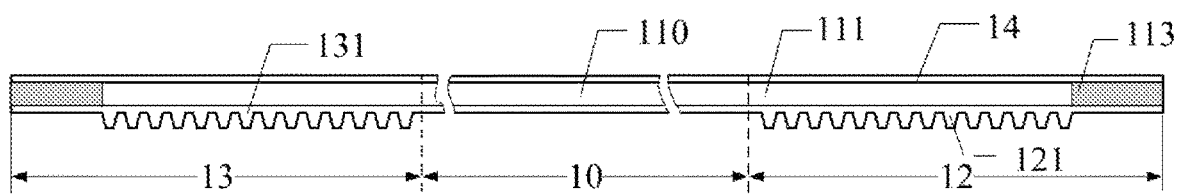
FIG. 13 is a schematic structural diagram of a flexible display panel main body provided by an embodiment of the application.
Figure 14:
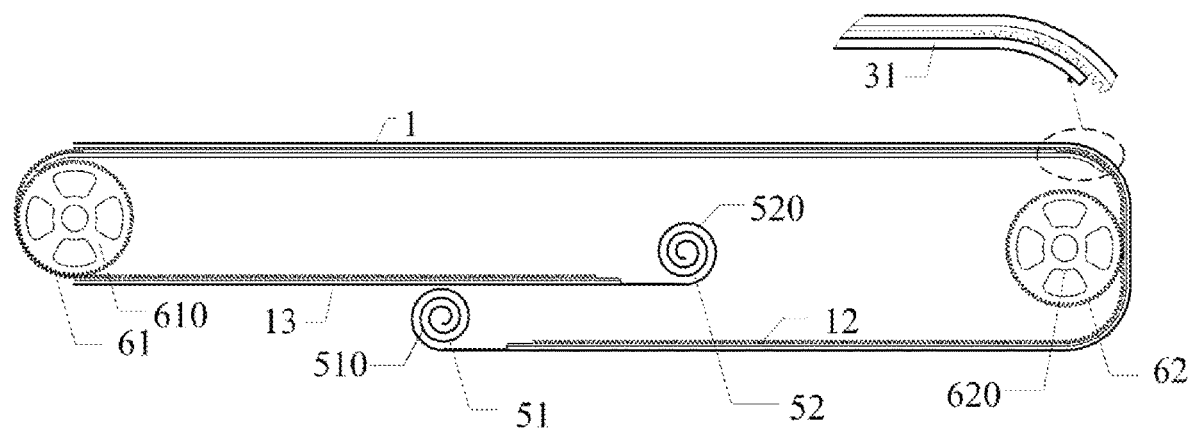
FIG. 14 is a schematic diagram of assembling the stretchable display panel provided by an embodiment of the application in a fully folded state.

As shown in FIGS. 13 and 14, FIG. 13 is a schematic structural diagram of a flexible display panel main body provided by an embodiment of the application, and FIG. 14 is an assembly schematic diagram of a stretchable display panel provided by an embodiment of the application in a fully folded state.

The winding mechanism includes a first winding mechanism 51 and a second winding mechanism 52. Both the first winding mechanism 51 and the second winding mechanism 52 are fixedly installed in the main frame 20. One end of the first flexible portion 12 is connected to the main body portion 10, and the other end of the first flexible portion 12 is fixedly connected to the first winding mechanism 51. One end of the second flexible portion 13 is connected to the main body portion 10, and the other end of the second flexible portion 13 is fixedly connected to the second winding mechanism 52.

Specifically, the first winding mechanism 51 includes a first elastic member 510. One end of the first elastic member 510 is fixedly connected to the main frame 20, and the other end of the first elastic member 510 is fixedly connected to the first flexible portion 12. When the first flexible portion 12 is in the first state, the first flexible portion 12 is received in the receiving space in the frame 2. The first elastic member 510 is in an elastic deformation state, and the first elastic member 510 is stretched, so that a certain pretension force is applied to the first flexible portion 12 through the first elastic member 510. Putting the first flexible portion 12 in a stretched state ensures the flatness of the first flexible portion 12 in the frame and prevents the first flexible portion 12 from shaking in the frame 2.

When the first flexible portion 12 is in the second state, the first flexible portion 12 is exposed to the outside of the frame 2. The first elastic member 510 is also in an elastic deformation state, and the amount of elastic deformation is increased, so that the first elastic member 510 applies a pretension force to the first flexible portion to ensure the flatness of the first flexible portion 12 when displaying images. When the first flexible portion 12 needs to be restored from the second state to the first state, the first elastic member 510 can also apply a folded-pulling force to the first flexible portion 12 so that the first flexible portion 12 can be received in the frame 2. The working principle and effect of the second elastic element 520 are the same as those of the first elastic element 510. For details, please refer to the first elastic element 510, which will not be repeated here.

In an embodiment of the present application, both the first elastic member 510 and the second elastic member 520 may be springs or winding springs. In practical applications, the winding mechanism can also include a drive motor. The drive motor is used to provide the first flexible portion 12 and the second flexible portion 13 with a pre-tensioning force and a folded-pulling force respectively, so as to realize the stretching and folding of the first flexible portion 12 and the second flexible portion 13.

Further, the stretchable display panel 100 further includes a transmission member. The transmission member is rotatably connected to the sub frame 30, and the flexible portion 11 is movably connected to the transmission member.

As shown in FIG. 14, the transmission member includes a first transmission member 61 and a second transmission member 62. The first transmission member 61 is rotatably connected to the first sub frame 31. The first flexible portion 12 is movably connected to the first transmission member 61. The second transmission member 62 is rotatably connected to the second sub frame 32. The second flexible portion 13 is movably connected to the second transmission member 62.

It should be noted that, in the embodiment of the present application, the first transmission member 61 and the second transmission member 62 only play a role of transmission, and do not provide power for transmission. In practical applications, it is also possible to provide driving force to the first transmission member 61 and the second transmission member 62 through a drive motor. In this way, the first sub frame 31 and the second sub frame 32 are driven to slide away from or close to the main frame 20, so as to realize the function of unfolding or folding the first flexible portion 12 and the second flexible portion 13.

Further, the transmission member includes a gear that is rotatably connected to the sub frame, and the flexible portion includes a crawler-type supporting plate, and the crawler-type supporting plate meshes with the gear.

In an embodiment of the present application, as shown in FIG. 14, the first transmission member 61 includes a first gear 610, and the second transmission member 62 includes a second gear 620. The first gear 610 and the second gear 620 are rotatably connected to the first sub frame 31 and the second sub frame 32, respectively. The first flexible portion 12 includes a first crawler supporting plate 121, and the second flexible portion 13 includes a second crawler supporting plate 131. Bottoms of the first crawler supporting plate 121 and the second crawler supporting plate 131 have a gear-spoke structure. The first crawler supporting plate 121 meshes with the first gear 610 through the gear-spoke structure. The second crawler supporting plate 131 meshes with the second gear 620 through the gear-spoke structure.

Hereinafter, the structure on the side of the first sub frame 31 will be described as an example. When the first flexible portion 12 is unfolded, the first sub frame 31 slides in the first direction x, and the first flexible portion 12 can move in the third direction z relative to the first gear 610. Under the meshing action of the first gear 610 and the gear-spokes, the first gear 610 is driven to move in a counterclockwise direction. When the first flexible portion 12 is in the unfolded state, the first crawler supporting plate 121 is unfolded together with the first flexible portion 12. The first crawler supporting plate 121 has a certain supporting rigidity when unfolded, and can be used to support the first flexible portion 12. Wrinkles, creases, or collapses of the first flexible portion 12 are avoided when the first flexible portion 12 is unfolded, so that the flatness of the flexible display panel main body 1 can be improved.

When folding the first flexible portion 12, the first sub frame 31 slides in a direction opposite to the first direction x. The first flexible portion 12 moves relative to the first gear 610 in a direction opposite to the third direction z under the effect of the folded-pulling force of the first winding mechanism 51. Under the effect of the meshing between the first gear 610 and the gear-spokes, the first gear 610 is driven to move in a clockwise direction.

The process of unfolding and folding the second flexible portion 13 is the same as the process and principle of unfolding and storing the first flexible portion 12 described above. For details, please refer to the above-mentioned process of unfolding and folding the first flexible portion, which will not be repeated here.

Further, the main body portion 10 includes a first display layer 110. The flexible portion 11 includes a second display layer 111 and an edge stress buffer layer 113. One end of the second display layer 111 is connected to the first display layer 110 and the other end of the second display layer 111 is connected to the edge stress buffer layer 113.

In an embodiment of the present application, the main body portion 10 includes a first display layer 110. The first flexible portion 12 and the second flexible portion 13 both include a second display layer 111. The two second display layers 111 are respectively connected to opposite ends of the first display layer 110. The first display layer 110 and the second display layer 111 can be integrally formed using a common process. The edge stress buffer layer 113 is disposed at an end of the second display layer 111 away from the first display layer 110.

The edge stress buffer layer 113 may be made of buffer materials such as buffer foam, TPU material, or soft silica gel. By providing the edge stress buffer layer 113 at both ends of the display layer of the flexible display panel main body 1, the edge stress buffer layer 113 is used to absorb the local concentrated stress received by the first flexible portion 12 and the second flexible portion 13 during the unfolding process, which can reduce the local concentrated stress on the first flexible portion 12 and the second flexible portion 13 during the unfolding process. Therefore, the dislocation of the film layer due to the stretching deformation of the first flexible portion 12 and the second flexible portion 13 during the unfolding process is alleviated.

The flexible display panel main body further includes a cover plate 14. The cover plate 14 covers the first display layer 110, the second display layer 111 and the edge stress buffer layer 113. The edge stress buffer layer 113 may be provided between the first crawler supporting plate 121, the second crawler supporting plate 131, and the cover plate 14, respectively. The first winding mechanism 51 can be fixedly connected to the first flexible portion 12 through the cover plate 14 and the first crawler supporting plate 121. The second winding mechanism 52 can be fixedly connected to the second flexible portion 13 through the cover plate 14 and the second crawler supporting plate 131. The way of fixing and fitting connection includes, but is not limited to, snap-fitting, bonding, and the like.

Beneficial effects of embodiments of the present disclosure are that: an embodiment of the present disclosure provides a stretchable display panel and an electronic device, comprising a stretchable display panel, wherein the stretchable display panel comprises: a flexible display panel main body, a linkage holding mechanism, and a frame. The flexible display panel main body comprises: a main body portion and a flexible portion connected to the main body portion. The frame comprises a main frame and a sub frame. The main body portion is fixedly installed on the main frame. The sub frame is slidably connected to the main frame along a first direction, wherein the flexible portion is movably installed on the secondary frame. The linkage holding mechanism is rotatably connected to one of the main frame and the sub frame, the linkage holding mechanism is slidably connected to the other of the main frame and the sub frame, and a linear motion of the sub frame is converted into a circular sliding motion of the linkage holding mechanism. In this way, through the circular sliding movement of the linkage holding mechanism, the smoothness and stability of the sliding of the sub frame relative to the main frame are improved, and the linkage holding mechanism is used to limit the sliding distance of the sub frame relative to the main frame to avoid the separation of the sub frame and the main frame when the applied external force is too large or sudden change, thereby reducing the risk of damage to the frame and the flexible display panel main body.

From above, although this application is disclosed as above in preferred embodiments, the above preferred embodiments are not intended to limit the application. Those of ordinary skill in the art can make various changes and modifications without departing from the spirit and scope of this application. Therefore, the protection scope of this application is based on the scope defined by the claims.

The invention claimed is:

1. A stretchable display panel, comprising:
   a flexible display panel main body comprising: a main body portion and a flexible portion connected to the main body portion;
   a linkage holding mechanism; and
   a frame comprising:
   a main frame, wherein the main body portion is fixedly installed on the main frame; and
   a sub frame slidably connected to the main frame along a first direction, wherein the flexible portion is movably installed on a secondary frame,
   wherein the linkage holding mechanism is rotatably connected to one of the main frame and the sub frame, the linkage holding mechanism is slidably connected to the other of the main frame and sub frame, and a linear motion of the sub frame is converted into a circular sliding motion of the linkage holding mechanism.

2. The stretchable display panel according to claim 1, wherein the linkage holding mechanism comprises:
   a first connection rod, wherein one end of the first connection rod is rotatably connected to one of the main frame and the sub frame, and the other end of the first connection rod is slidably connected to the other of the main frame and the sub frame; and
   a second connecting rod arranged opposite to the first connecting rod, wherein one end of the connecting rod is rotatably connected to one of the main frame and the sub frame, and the other end of the second connecting rod is slidably connected to the other of the main frame and the sub frame.

3. The stretchable display panel according to claim 2, wherein the main frame or the sub frame is provided with a first sliding groove and a second sliding groove, the linkage holding mechanism further includes a first fixing member and a second fixing member, the first fixing member passes through the first sliding groove and is fixedly connected to the other end of the first connecting rod, and the second fixing member passes through the second sliding groove and is fixedly connected to the other end of the second connecting rod,
   wherein, when the flexible portion is in a first state, the sub frame is close to the main frame, and the first fixing member and the second fixing member are close to each other; and when the flexible member is in the second state, the sub frame is away from the main frame, and the first fixing member and the second fixing member are away from each other.

4. The stretchable display panel according to claim 3, wherein the first sliding groove is a straight groove or an arc groove, and the second sliding groove is the same size and shape as the first sliding groove.

5. The stretchable display panel according to claim 4, wherein, when the first sliding groove is a linear groove, a length direction of the first sliding groove is parallel or inclined to a second direction, and the second direction is perpendicular to the first direction.

6. The stretchable display panel according to claim 1, wherein the linkage holding mechanism comprises a first linkage holding mechanism and a second linkage holding mechanism, and the sub frame comprises a first sub frame and a second sub frame,
wherein:
the first sub frame is slidably connected to the main frame, the first linkage holding mechanism is rotatably connected to one of the main frame and the first sub frame, and the first linkage holding mechanism is slidably connected to the other of the main frame and the first sub frame; and
the second sub frame is arranged opposite to the first sub frame and is slidably connected to the main frame, the second linkage holding mechanism is rotatably connected to one of the main frame and the second sub frame, and the second linkage holding mechanism is slidably connected to the other of the main frame and the second sub frame.

7. The stretchable display panel according to claim 1, wherein the main frame is provided with a plurality of sliding grooves arranged at intervals, and the sub frame is provided with a plurality of supporting bars arranged at intervals,
wherein the supporting bars are slidably received in the sliding grooves.

8. The stretchable display panel according to claim 1, wherein one end of the sub frame away from the main frame is arc-shaped.

9. The stretchable display panel according to claim 1, wherein the stretchable display panel comprises a winding mechanism, and the winding mechanism is installed in the frame,
wherein, one end of the flexible portion is connected to the main body portion, and the other end of the flexible portion is fixedly connected to the winding mechanism.

10. The stretchable display panel according to claim 9, wherein the winding mechanism comprises an elastic member, and the other end of the flexible portion is fixedly connected to the elastic member,
wherein, when the flexible portion is in a first state or a second state, the elastic member is in an elastic deformation state.

11. The stretchable display panel according to claim 1, wherein the stretchable display panel further comprises a transmission member, the transmission member is rotatably connected to the sub frame, and the flexible portion is movably connected to the transmission member.

12. The stretchable display panel according to claim 11, wherein the transmission member comprises a gear, the gear is rotatably connected to the sub frame, and the flexible portion comprises a crawler-type supporting plate, and the crawler-type supporting plate meshes with the gear.

13. The stretchable display panel according to claim 1, wherein the main body portion comprises a first display layer, the flexible portion comprises a second display layer and an edge stress buffer layer, one end of the second display layer is connected to the first display layer, and the other end of the second display layer is connected to the edge stress buffer layer.

14. An electronic device, comprising a stretchable display panel, wherein the stretchable display panel comprises:
a flexible display panel main body comprising: a main body portion and a flexible portion connected to the main body portion;
a linkage holding mechanism; and
a frame comprising:
a main frame, wherein the main body portion is fixedly installed on the main frame; and
a sub frame slidably connected to the main frame along a first direction, wherein the flexible portion is movably installed on a secondary frame,
wherein the linkage holding mechanism is rotatably connected to one of the main frame and the sub frame, the linkage holding mechanism is slidably connected to the other of the main frame and the sub frame, and a linear motion of the sub frame is converted into a circular sliding motion of the linkage holding mechanism.

15. The electronic device according to claim 14, wherein the linkage holding mechanism comprises:
a first connection rod, wherein one end of the first connection rod is rotatably connected to one of the main frame and the sub frame, and the other end of the first connection rod is slidably connected to the other of the main frame and the sub frame; and
a second connecting rod arranged opposite to the first connecting rod, wherein one end of the connecting rod is rotatably connected to one of the main frame and the sub frame, and the other end of the second connecting rod is slidably connected to the other of the main frame and the sub frame.

16. The electronic device according to claim 15, wherein the main frame or the sub frame is provided with a first sliding groove and a second sliding groove, the linkage holding mechanism further includes a first fixing member and a second fixing member, the first fixing member passes through the first sliding groove and is fixedly connected to the other end of the first connecting rod, and the second fixing member passes through the second sliding groove and is fixedly connected to the other end of the second connecting rod,
wherein, when the flexible portion is in a first state, the sub frame is close to the main frame, and the first fixing member and the second fixing member are close to each other;
When the flexible member is in the second state, the sub frame is away from the main frame, and the first fixing member and the second fixing member are away from each other.

17. The electronic device according to claim 16, wherein the first sliding groove is a straight groove or an arc groove, and the second sliding groove is the same size and shape as the first sliding groove.

18. The electronic device according to claim 17, wherein, when the first sliding groove is a linear groove, a length direction of the first sliding groove is parallel or inclined to a second direction, and the second direction is perpendicular to the first direction.

19. The electronic device according to claim 14, wherein the linkage holding mechanism comprises a first linkage holding mechanism and a second linkage holding mechanism, and the sub frame comprises a first sub frame and a second sub frame,
wherein:

the first sub frame is slidably connected to the main frame, the first linkage holding mechanism is rotatably connected to one of the main frame and the first sub frame, and the first linkage holding mechanism is slidably connected to the other of the main frame and the first sub frame; and the second sub frame is arranged opposite to the first sub frame and is slidably connected to the main frame, the second linkage holding mechanism is rotatably connected to one of the main frame and the second sub frame, and the second linkage holding mechanism is slidably connected to the other of the main frame and the second sub frame.

20. The electronic device according to claim 14, wherein the main frame is provided with a plurality of sliding grooves arranged at intervals, and the sub frame is provided with a plurality of supporting bars arranged at intervals, wherein the supporting bars are slidably received in the sliding grooves.

\* \* \* \* \*